US012662177B2

(12) United States Patent
Kobayashi

(10) Patent No.: US 12,662,177 B2
(45) Date of Patent: Jun. 23, 2026

(54) OVERHEAD TRANSPORT VEHICLE SYSTEM

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 369 days.

(21) Appl. No.: 18/681,137

(22) PCT Filed: Mar. 30, 2022

(86) PCT No.: PCT/JP2022/016114
§ 371 (c)(1),
(2) Date: Feb. 5, 2024

(87) PCT Pub. No.: WO2023/017655
PCT Pub. Date: Feb. 16, 2023

(65) Prior Publication Data
US 2025/0128745 A1 Apr. 24, 2025

(30) Foreign Application Priority Data

Aug. 12, 2021 (JP) ................................. 2021-131719

(51) Int. Cl.
*G06F 7/00* (2006.01)
*B61B 3/02* (2006.01)
(Continued)

(52) U.S. Cl.
CPC ............... *B61L 27/04* (2013.01); *B61B 3/02* (2013.01); *B66C 13/48* (2013.01);
(Continued)

(58) Field of Classification Search
CPC ... B61L 27/04; B61B 3/00; B61B 3/02; B66C 13/48; B66C 19/00; H10P 72/30;
(Continued)

(56) References Cited

U.S. PATENT DOCUMENTS

| | | | | |
|---|---|---|---|---|
| 6,092,678 A | * | 7/2000 | Kawano | H10P 72/3221 |
| | | | | 340/685 |
| 8,688,261 B2 | * | 4/2014 | Hirota | B25J 9/1692 |
| | | | | 700/214 |

FOREIGN PATENT DOCUMENTS

| | | | | |
|---|---|---|---|---|
| JP | 2018-177425 A | 11/2018 | | |
| KR | 20090014104 A | * | 2/2009 | .......... H10P 72/7602 |
| KR | 20210138344 A | * | 11/2021 | ......... G05B 19/4189 |

* cited by examiner

*Primary Examiner* — Yolanda R Cumbess
(74) *Attorney, Agent, or Firm* — Keating & Bennett, LLP

(57) ABSTRACT

An overhead transport vehicle system includes an overhead transport vehicle to travel on a track to transport an object and including a holder to transfer the object to a placement portion below the track, and a teaching unit. The system is configured or programmed to cause the overhead transport vehicle to hold the teaching unit and perform teaching of a transfer operation to the placement portion. The holder includes a power-feeding terminal to feed power from a power source and a first communication terminal to receive teaching information. The teaching unit includes a power-receiving terminal to which the power is fed and a second communication terminal to transmit teaching information. When the teaching unit is held by the holder, the power-receiving terminal and the power-feeding terminal become energizable and the first and second communication terminals become communicable.

18 Claims, 10 Drawing Sheets

(51) Int. Cl.

| | |
|---|---|
| *B61L 27/04* | (2006.01) |
| *B66C 13/48* | (2006.01) |
| *H10P 72/30* | (2026.01) |
| *B66C 19/00* | (2006.01) |

(52) U.S. Cl.
CPC ...... *H10P 72/3216* (2026.01); *H10P 72/3221* (2026.01); *B66C 19/00* (2013.01)

(58) Field of Classification Search
CPC ............ H10P 72/3206; H10P 72/3214; H10P 72/3216; H10P 72/3218; H10P 72/3221; H10P 72/3222; H10P 72/33; H10P 72/7602; B65G 1/00; B65G 1/04; B65G 1/0471
USPC ................................. 700/229, 213, 228, 230
See application file for complete search history.

*Fig.3*
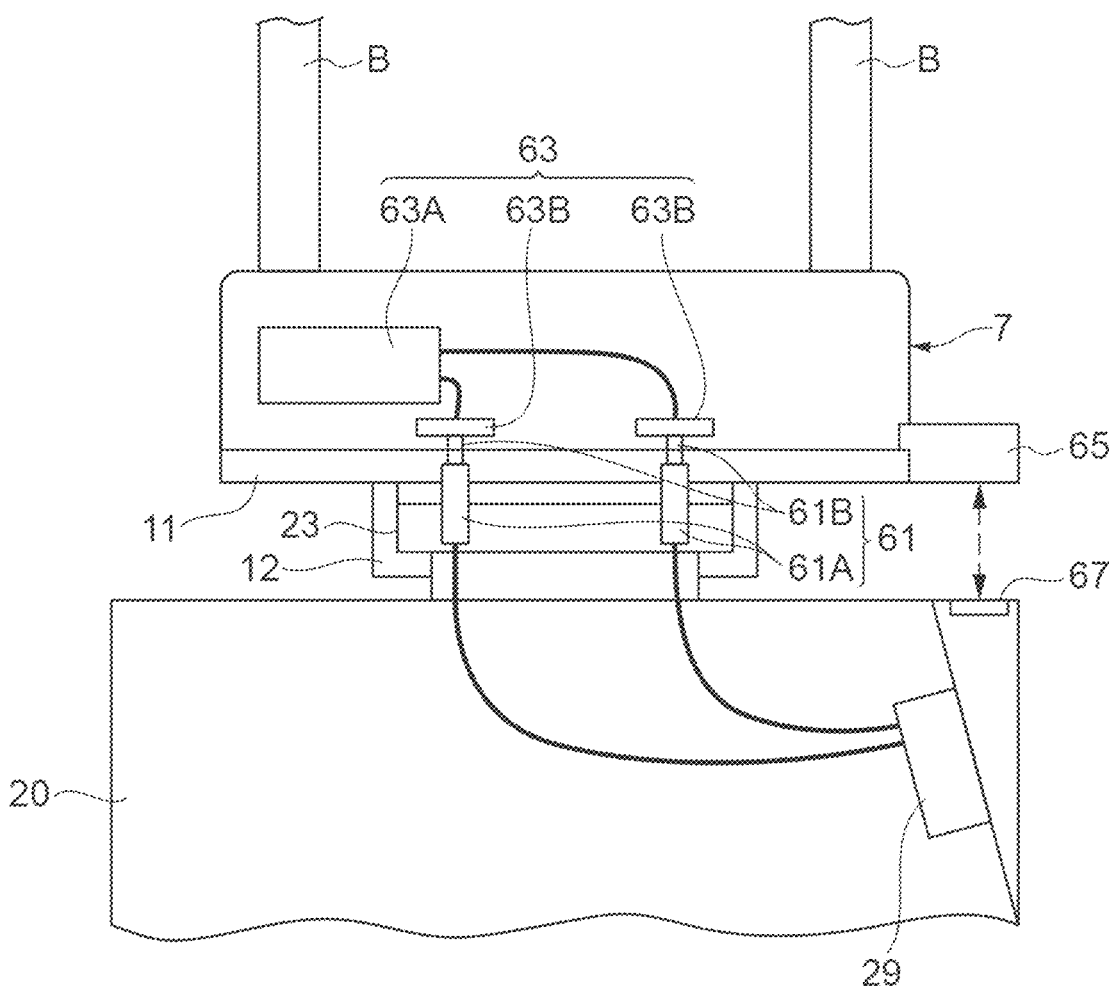
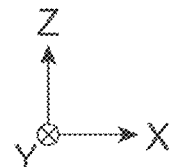

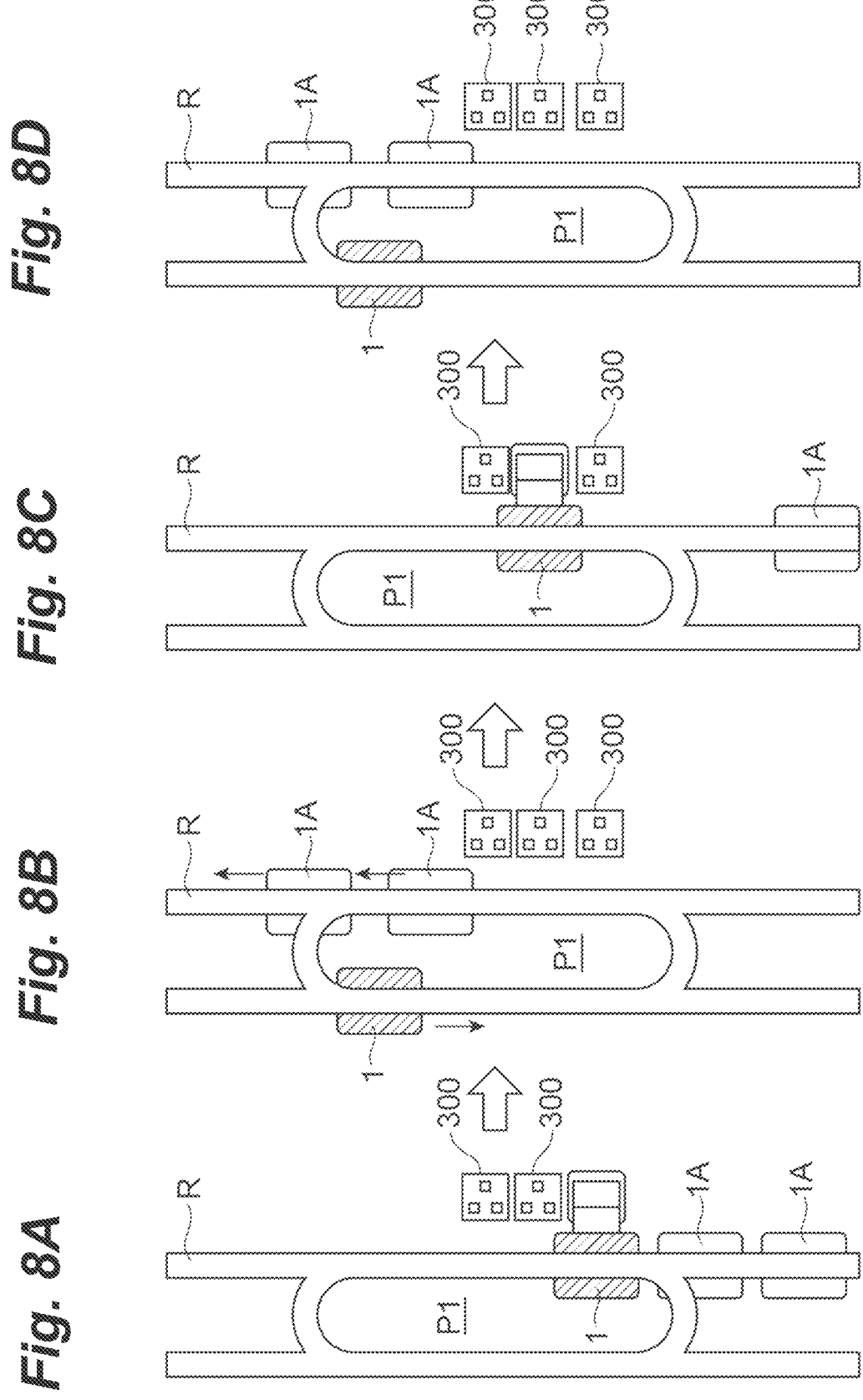
*Fig. 8A*    *Fig. 8B*    *Fig. 8C*    *Fig. 8D*

OVERHEAD TRANSPORT VEHICLE SYSTEM

BACKGROUND OF THE INVENTION

1. Field of the Invention

An aspect of the present invention relates to an overhead transport vehicle system.

2. Description of the Related Art

An overhead transport vehicle that travels on a track installed near a ceiling to transport an article has been known. Such an overhead transport vehicle, in order to properly transfer an article to a specified placement unit (load port), needs teaching operations to cause (teach) the overhead transport vehicle to memorize in advance where the overhead transport vehicle should be stopped on the track, how much a holding unit (more precisely, a gripper) should be fed in the lateral direction, how much the holding unit should be rotated with the vertical direction as its axis of rotation, and how much the holding unit should be lowered. For example, Japanese Unexamined Patent Publication No. 2018-177425 discloses an overhead transport vehicle system in which teaching operations for each placement unit are automatically performed after a teaching unit is attached to the holding unit of the overhead transport vehicle by a worker.

SUMMARY OF THE INVENTION

For such an overhead transport vehicle system, there is a desire to automate a series of teaching operations, from the holding unit holding the teaching unit to teaching at each placement unit. However, in the conventional overhead transport vehicle system described above, it is necessary to electrically connect the holder of the overhead transport vehicle to the teaching unit by wiring or other means in order to feed electric power to the teaching unit and control the teaching unit, and this connection work is done manually. This manual connection work is an obstacle to automating a series of teaching operations.

In view of this, example embodiments of the present invention provide overhead transport vehicle systems that each automate a series of teaching operations.

An overhead transport vehicle system according to an aspect of an example embodiment of the present invention includes an overhead transport vehicle to travel on a track to transport an object and including a holder to transfer the object to a placement portion below the track, and a teaching unit, the system being configured or programmed to cause the overhead transport vehicle to hold the teaching unit and perform teaching of a transfer operation to the placement portion to be performed, in which the holder includes a power-feeding terminal to feed power from a power source, and a first communication terminal to receive information on the teaching, the teaching unit includes a power-receiving terminal to which the power is fed, and a second communication terminal to transmit the information on the teaching, and when the teaching unit is held by the holder, the power-receiving terminal and the power-feeding terminal become energizable and the first communication terminal and the second communication terminal become communicable.

In the overhead transport vehicle system of this configuration, when the teaching unit is held by the holder, the power-receiving terminal and the power-feeding terminal become energizable and the first communication terminal and the second communication terminal become communicable. This configuration enables the holder to feed power to the teaching unit and exchange the information on teaching with the teaching unit without requiring manual intervention. As a result, a series of teaching operations can be automated.

In an overhead transport vehicle system according to an aspect of an example embodiment of the present invention, when the teaching unit is held by the holder, the power-receiving terminal and the power-feeding terminal may be in contact with each other, and the first communication terminal and the second communication terminal may be close to each other within a predetermined distance. This configuration allows electrical connection of the power-receiving terminal and the power-feeding terminal with a simple configuration, and also allows wireless communication between the first communication terminal and the second communication terminal.

An overhead transport vehicle system according to an aspect of an example embodiment of the present invention, the power-feeding terminal may be located in the back side of a recess in a lower surface of the holder, and the power-receiving terminal may protrude from an upper surface of the teaching unit and be extendable and retractable. With this configuration, the power-feeding terminal is located in the back side of the recess in the lower surface of the holder, reducing the possibility of a worker inadvertently touching the power-feeding terminal. As a result, worker safety can be improved. Furthermore, since the power-receiving terminal is extendable and retractable, the possibility of damage to the power-receiving terminal and the power feeding terminal can be reduced even if the power-receiving terminal makes strong contact with the power feeding terminal when the holder is holding the teaching unit.

In an overhead transport vehicle system according to an aspect of an example embodiment of the present invention, a tapered portion to guide the power-receiving terminal to the back side of the recess may be located on the opening side of the recess. With this configuration, the power-receiving terminal and the power-feeding terminal can be easily connected to each other.

An overhead transport vehicle system according to an aspect of an example embodiment of the present invention may further include a controller configured or programmed to control traveling of the overhead transport vehicle, in which the controller may be configured or programmed to perform holding control to cause the overhead transport vehicle to travel toward a predetermined position where the teaching unit is stored, stop at the predetermined position and lower the holder, and hold the teaching unit by the holder, and teaching control to cause the overhead transport vehicle holding the teaching unit to travel toward a transfer position corresponding to the placement portion, stop at the transfer position, and perform transfer operation to the placement portion to acquire teaching data. This configuration allows regular teaching work to be automated.

In an overhead transport vehicle system according an aspect of an example embodiment of the present invention, the track may include a loop portion with a loop shape, a plurality of the placement portions may be located along the loop portion, and when the teaching is completed for one of the plurality of placement portions, the controller may be configured or programmed to cause the overhead transport vehicle to travel around the loop portion, and then to perform the teaching for another one of the plurality of placement portions adjacent to the one of the plurality of placement portions. With this configuration, the overhead transport vehicle travels around for each teaching of a single placement portion, thus reducing or minimizing the congestion of other overhead transport vehicles that follow due to the overhead transport vehicle performing the teaching. As a result, even when teaching is performed while the overhead transport vehicle system is in operation, the occurrence of congestion of the overhead transport vehicles can be reduced.

According to example embodiments of the present invention, a series of teaching operations can be automated.

The above and other elements, features, steps, characteristics and advantages of the present invention will become more apparent from the following detailed description of the example embodiments with reference to the attached drawings.

BRIEF DESCRIPTION OF THE DRAWINGS

FIG. 1 is a side view illustrating an overhead transport vehicle according to an example embodiment of the present invention.

FIG. 3 is a schematic diagram illustrating the positional relationship between power-feeding terminals and power-receiving terminals, and the positional relationship between a first communication terminal and a second communication terminal when the teaching unit is held in the holder.

FIGS. 8A to 8D are diagrams illustrating examples of the movement of an overhead transport vehicle when teaching is performed by an overhead transport vehicle system according to an example embodiment of the present invention.

DETAILED DESCRIPTION OF THE EXAMPLE EMBODIMENTS

Figure 2A:
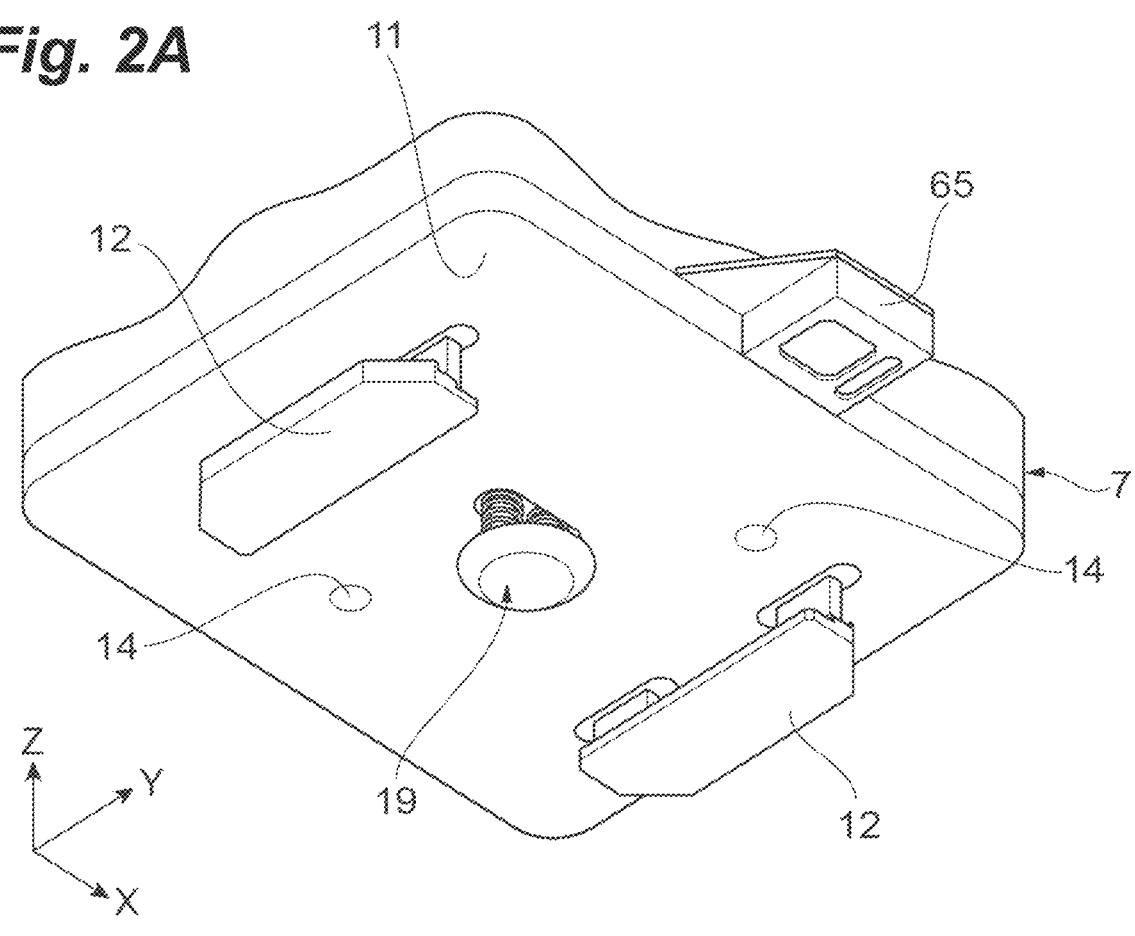
FIG. 2A is a perspective view of a base of a holder when viewed from below.

Example embodiments according to example embodiments of the present invention will now be described in detail with reference to the drawings. In description of the drawings, like elements are designated by like reference signs, and duplicate description is omitted. In the drawings, except for FIG. 7 to FIGS. 10A to 10C, the mutually orthogonal X, Y, and Z axes are illustrated for convenience of explanation.

Figure 1:
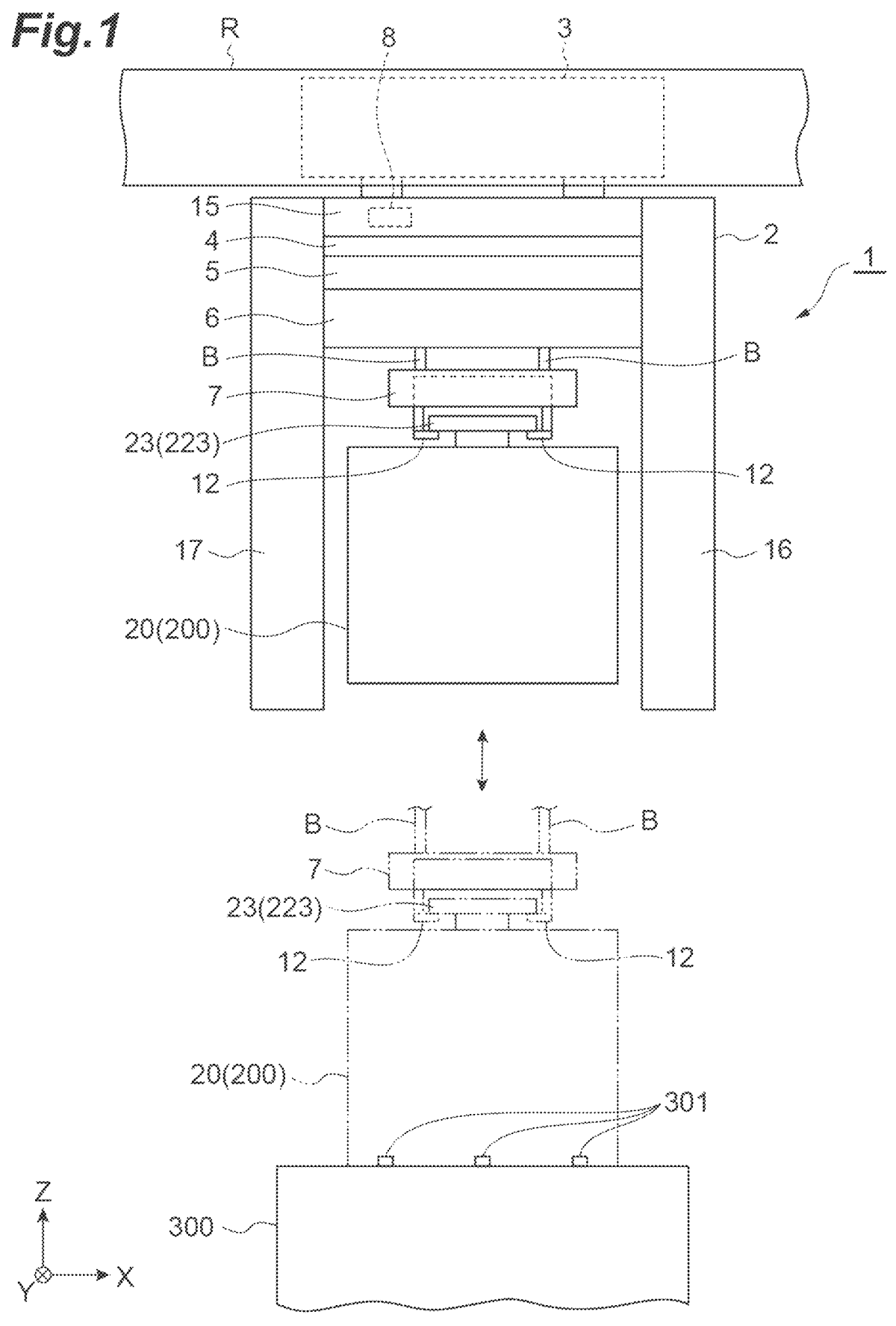
Figure 4:
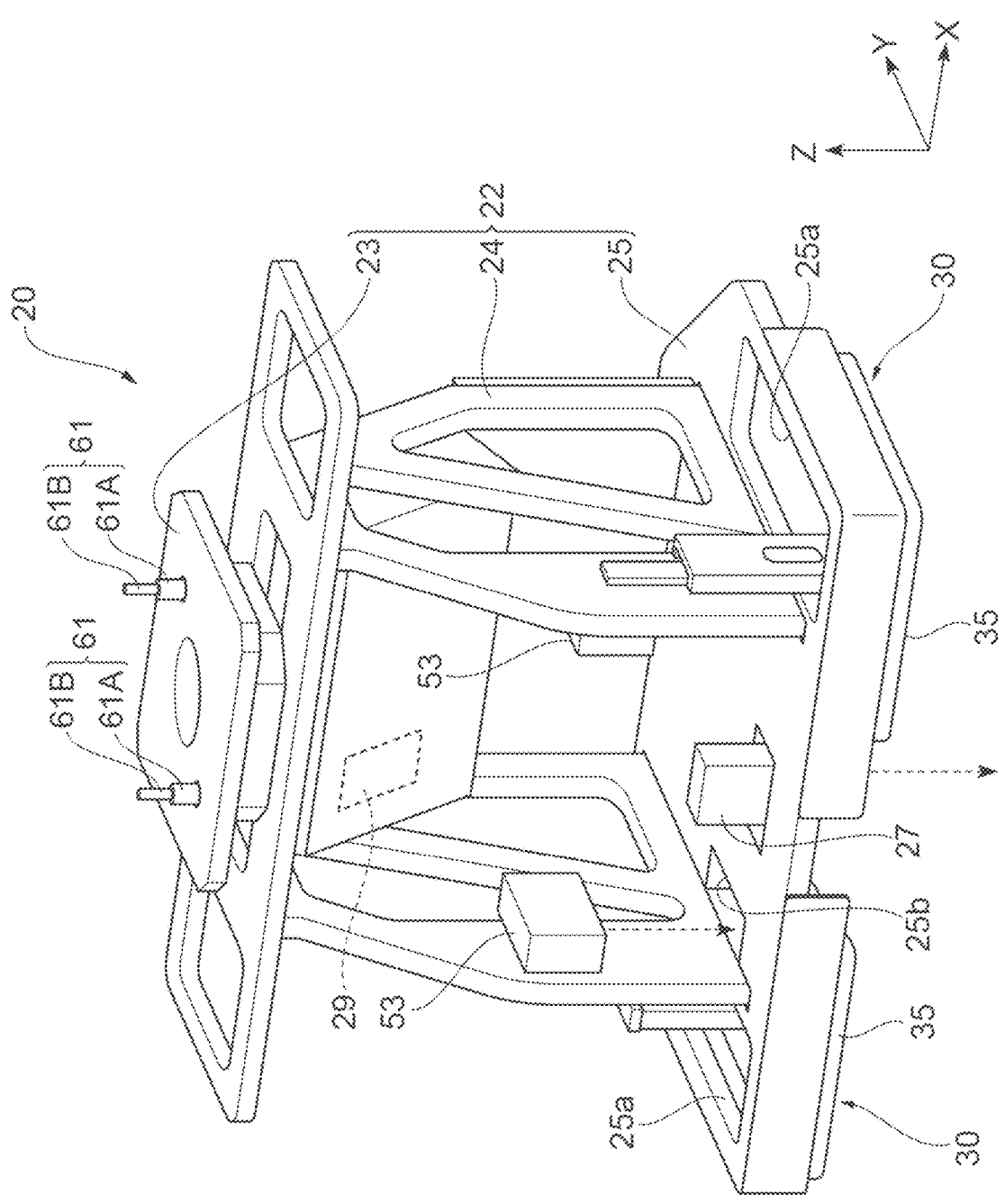
FIG. 4 is a perspective view of the teaching unit when viewed from the front.
Figure 5:
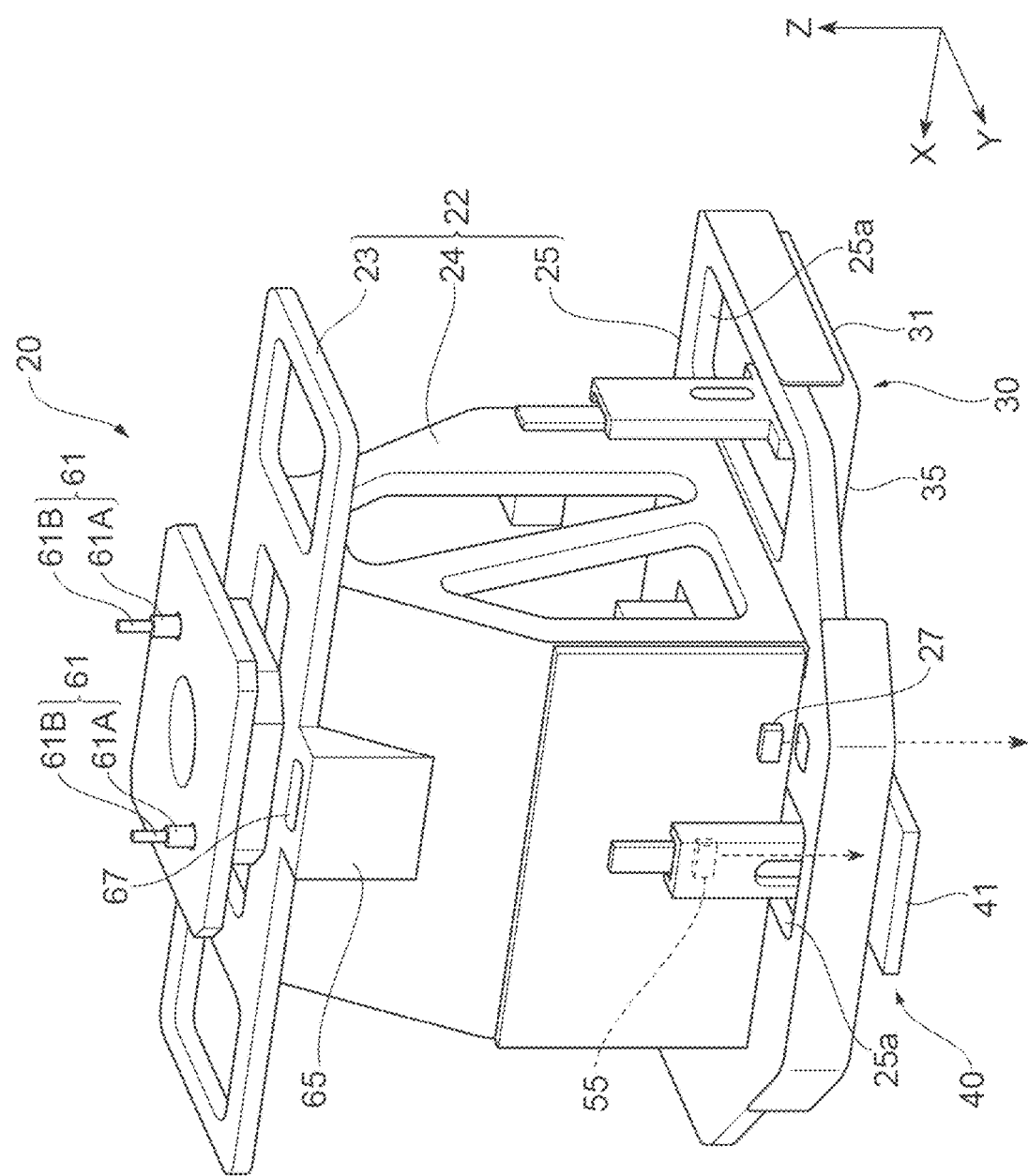
FIG. 5 is a perspective view of the teaching unit viewed from the rear.
Figure 6A:
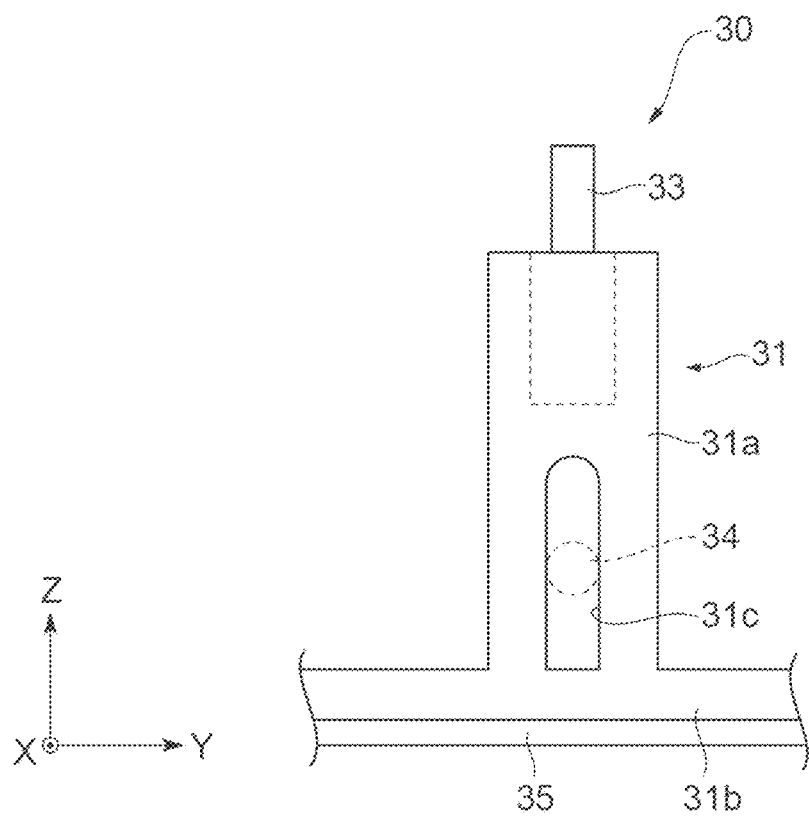
FIG. 6A is a front view illustrating a first detector.
Figure 6B:
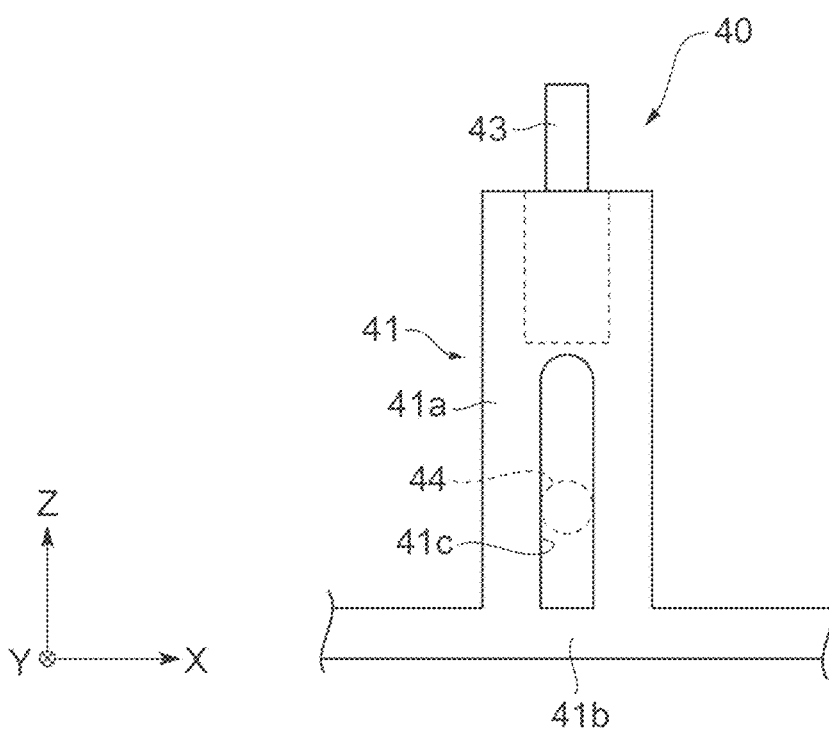
FIG. 6B is a front view illustrating a second detector.
Figure 7:
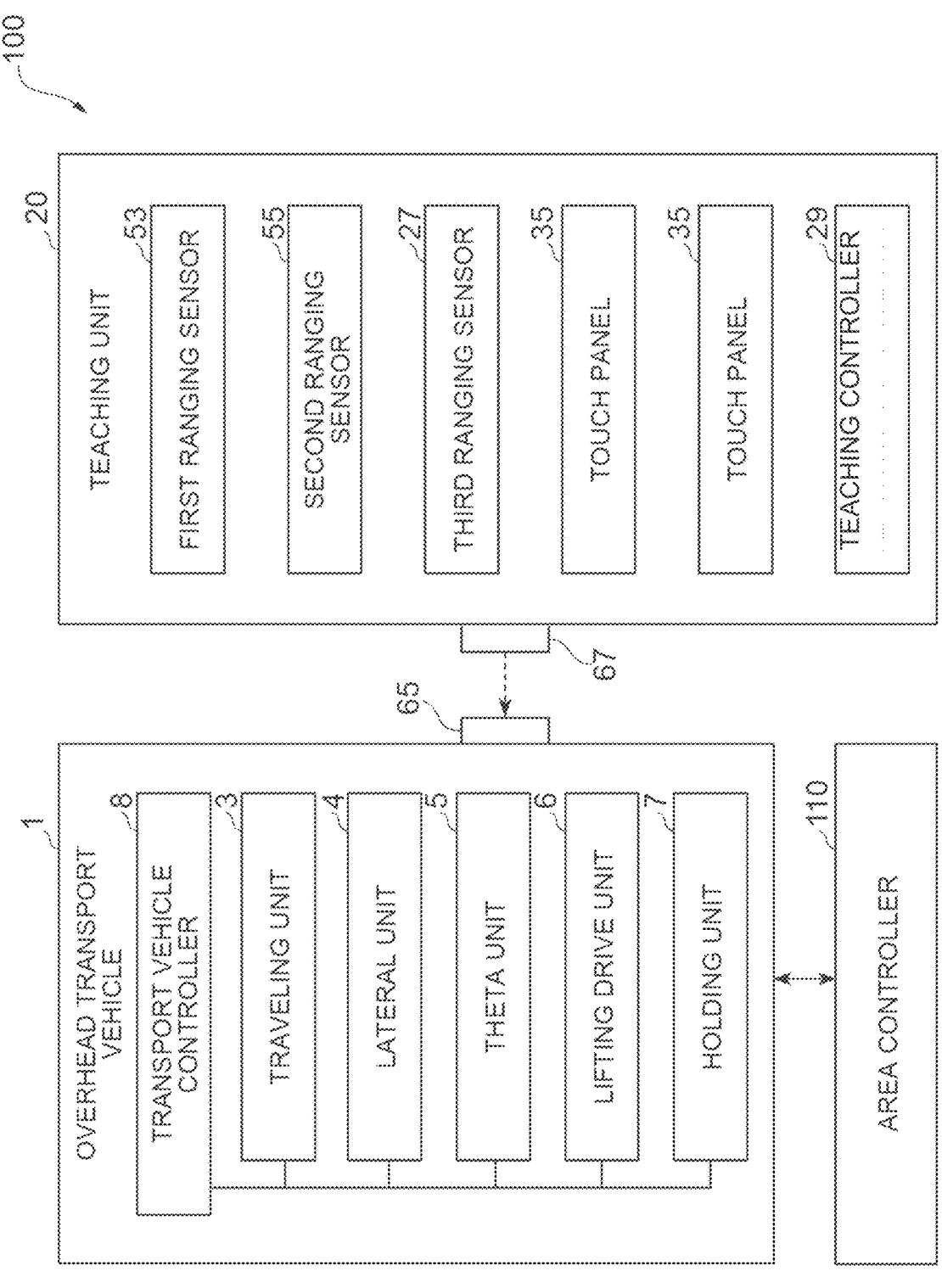
FIG. 7 is a block diagram illustrating a functional configuration of an overhead transport vehicle system.

An overhead transport vehicle system 100 according to an example embodiment includes a plurality of overhead transport vehicles 1 as illustrated in FIG. 1, a teaching unit 20 as illustrated in FIG. 4 and FIG. 5, and an area controller (controller) 110 as illustrated in FIG. 7.

As illustrated in FIG. 1, the overhead transport vehicle 1 of the present example embodiment travels along a track R installed near a ceiling of a clean room in which semiconductor devices are manufactured. The overhead transport vehicle 1 of the present example embodiment transports a front opening unified pod (FOUP) in which a plurality of semiconductor wafers are accommodated, or a container (object) 200 such as a reticle pod accommodating reticles, and transfers the container 200 to a load port (placement portion) 300 or the like provided on a processing device configured to perform various kinds of processing on the semiconductor wafers. The container 200 includes a flange 223 that is held by a pair of grippers 12, 12.

The overhead transport vehicle 1 includes a frame unit 2, a traveling unit 3, a lateral unit 4, a theta unit 5, a lifting drive unit 6, a holder 7, and a transport vehicle controller 8. The frame unit 2 includes a center frame 15, a front frame 16, and a rear frame 17. The front frame 16 extends downward from an end portion on a front side of the center frame 15 (front side in a traveling direction of the overhead transport vehicle 1). The rear frame 17 extends downward from an end portion on a rear side of the center frame 15 (rear side in the traveling direction of the overhead transport vehicle 1).

The traveling unit 3 is disposed above the center frame 15. For example, the traveling unit 3 travels along the track R by receiving electric power fed from a high-frequency current line installed along an extending direction (X-axis direction) of the track R in a non-contact manner. The lateral unit 4 is disposed on a lower side of the center frame 15. The lateral unit 4 causes the theta unit 5, the lifting drive unit 6, and the holder 7 to move in the lateral direction (Y-axis direction) orthogonal to the traveling direction. The theta unit 5 is disposed on a lower side of the lateral unit 4. The theta unit 5 turns the lifting drive unit 6 and the holder 7 in a horizontal plane. The lifting drive unit 6 is disposed on a lower side of the theta unit 5. The lifting drive unit 6 causes the holder 7 to be lifted and lowered. The holder 7 is disposed below the lifting drive unit 6.

As illustrated in FIG. 1 to FIG. 3, the holder 7 includes a base 11, the pair of grippers 12, 12, and a center cone 19. The pair of grippers 12, 12 is supported by the base 11 to be able to be opened or closed along the horizontal direction. The pair of grippers 12, 12 is opened or closed by a driving motor (not illustrated) and a link mechanism (not illustrated). The center cone 19 is inserted into an insertion hole of the flange 223, thereby positioning the holder 7 with respect to the container 200. In the present example embodiment, a height position of the holder 7 is adjusted so that holding surfaces of the grippers 12 become lower than a height of a lower surface of the flange 223 when the pair of grippers 12, 12 is in an opened state. In this state, when the pair of grippers 12, 12 is caused to be in a closed state, the holding surfaces of the grippers 12 get under the lower surface of the flange 223, and the lifting drive unit 6 is lifted in this state. Accordingly, the flange 223 is held (gripped) by the pair of grippers 12, 12, and the container 200 is held.

Figure 2B:
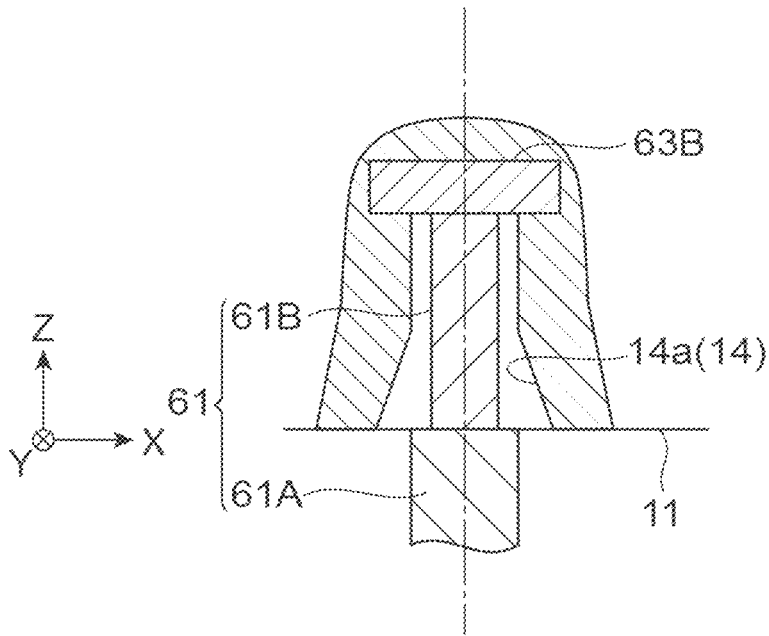
FIG. 2B is a sectional view of a recess formed in the base.

Although FIG. 1 and FIGS. 2A and 2B do not illustrate this, the holder 7 may include a buffering mechanism configured to prevent vibration from being transmitted to the container 200, the vibration being caused when the traveling unit 3 travels or the holder 7 is lifted or lowered. The holder 7 further includes power-feeding terminals 63B to feed power from a power source, and a first communication terminal 65 configured or programmed to receive information on teaching (detailed in a later section) from the teaching unit 20, as illustrated in FIGS. 2A, 2B, and FIG. 3.

The power-feeding terminals 63B are the portions to which power fed from the high-frequency current line is fed in the traveling unit 3 via a power control unit 63A, and are configured to feed power to power-receiving terminals 61 in the teaching unit 20, which is described in detail in a later section. More precisely, the power-feeding terminals 63B feed power to the power-receiving terminals 61, which are in contact with the power-feeding terminals 63B.

Each of the power-feeding terminals 63B is provided in the back side of a recess 14 formed in a lower surface of the base 11 in the holder 7. Two recesses 14 are provided in the lower surface of the base 11. The two recesses 14, 14 are formed so that the two power-receiving terminals 61, 61 are respectively insertable into the two recesses 14, 14 when the teaching unit 20 is held by the holder 7. A tapered portion 14a that guides the power-receiving terminal 61 to the back side of the recess 14 is formed on the opening side of the recess 14.

The transport vehicle controller 8 illustrated in FIG. 1 and FIG. 7 is disposed in the center frame 15. The transport vehicle controller 8 is an electronic control unit including a central processing unit (CPU), a read only memory (ROM), a random access memory (RAM), and the like. The transport vehicle controller 8 is configured or programmed to each portion or component of the overhead transport vehicle 1.

The transport vehicle controller 8 of the present example embodiment is configured or programmed to control the operation of the overhead transport vehicle 1 based on preset transfer conditions to transfer the container 200 to the load port 300. The transfer conditions are control parameters usable to transfer the container 200 to the load port 300. The transfer conditions may include information on the positions of the pair of grippers 12, 12 in the X-, Y-, and Z-axis directions when transferring the container 200 to the load port 300, and information on the positions in the θ direction, which are the positions of the pair of grippers 12, 12 in a rotational direction in the horizontal plane.

More precisely, the transfer conditions may include the amount of drive of the traveling unit 3 (stop position), the amount of drive of the lateral unit 4, the amount of drive of the theta unit 5, and the amount of drive of the lifting drive unit 6 when the container 200 is transferred to the load port 300. The transfer conditions are stored in a storage unit (not illustrated) of the transport vehicle controller 8. The transport vehicle controller 8 also is configured or programmed to control the teaching operation when the teaching unit 20, which is described in detail in a later section, is attached.

The area controller 110 illustrated in FIG. 7 is an electronic control unit including a CPU, a ROM, a RAM, and the like. The area controller 110 may include or be defined by, for example, as software such that a program stored in the ROM is loaded into the RAM to be executed by the CPU. The area controller 110 may include or be defined by hardware such as an electronic circuit.

The area controller 110 is configured or programmed to communicate with and control a plurality of the overhead transport vehicles 1. In other words, the area controller 110 is configured or programmed to execute various commands to the overhead transport vehicles 1. For example, the area controller 110 is configured or programmed to execute a transport command to the overhead transport vehicles 1.

In the overhead transport vehicle system 100 as described above, teaching is performed periodically when starting the transport of the container 200 by the overhead transport vehicle 1, or as maintenance. Teaching includes recognizing how much the transfer position of the container 200 deviates from a target position when the container 200 is transferred according to the preset transfer conditions, and storing the operation to be performed by the overhead transport vehicle 1 to eliminate the deviation from the target position. Examples of an operation to be performed include the amount of correction for transfer conditions (information on teaching), that is, the amount of drive of the traveling unit 3, the amount of drive of the lateral unit 4, the amount of drive of the theta unit 5, and the amount of drive of the lifting drive unit 6.

The overhead transport vehicle system 100 of the present example embodiment causes the holder 7 of the overhead transport vehicle 1 to hold the teaching unit 20, and causes teaching of the transfer operation to the load port 300 to be automatically performed. Such automatic performance of teaching is commanded by the area controller 110 and controlled by the transport vehicle controller 8. The following is a detailed description of the teaching unit 20 used for teaching.

As illustrated in FIGS. 3 through 7, the teaching unit 20 includes a body 22, a pair of first detectors 30, 30, a second detector 40, third ranging sensors 27, the power-receiving terminals 61, a second communication terminal 67, and a teaching controller 29. The teaching unit 20 is structured to be held by the overhead transport vehicle 1. The teaching unit 20 is equivalent or approximately equivalent in size to the container 200.

The body 22 includes a flange 23, a first body 24, and a second body 25. The flange 23 is held by the grippers 12, 12 (see FIGS. 1 and 2A and 2B), which are mounted on the holder 7 of the overhead transport vehicle 1 and lifted and lowered. The flange 23 is disposed in the upper center of the teaching unit 20. The first body 24 extends in the Z-axis direction and extends upright from the second body 25. The first detectors 30, 30 and the second detector 40, which are described in detail in the following section, are fixed to the first body 24. The second body 25 is a plate-shaped structure extending in the horizontal direction. First ranging sensors 53, the third ranging sensors 27, 27, and the teaching controller 29, which will be described in detail in a later section, are fixed to the second body 25.

The pair of first detectors 30, 30 are arranged in the X-axis direction. Each of the first detectors 30 includes a support 31, a linear guide 33, a first restrictor 34, a touch panel 35, and the first ranging sensor 53.

The support 31 is detachable from the body 22. The support 31 includes a vertical supporting portion 31a extending in the vertical direction and a horizontal supporting portion 31b extending in the horizontal direction. The vertical supporting portion 31a is the portion fixed to the first body 24 of the body 22 via the linear guide 33, and the horizontal supporting portion 31b is the portion supporting the touch panel 35. The vertical supporting portion 31a is inserted through a through hole 25a provided in the second body 25. The linear guide 33 supports the support 31 to allow for sliding movement in the Z-axis direction with respect to the body 22. The first restrictor 34 is fixed to the body 22 and restricts the movement of the support 31 in the Z-axis direction by the linear guide 33 within a certain range. Specifically, the first restrictor 34 restricts the movement of the support 31 in the Z-axis direction to the extent that the support 31 can move within a hole 31c extending in the Z-axis direction.

The touch panel 35 is fixed to the support 31, which is detachable from the body 22. The touch panel 35 includes, on its lower surface, a touch surface along the second body 25. The touch panel 35 detects the positions of positioning pins 301 by contacting the tips of the positioning pins 301 (see FIG. 1) installed on the load port 300.

The first ranging sensor 53 is fixed to the second body 25. The first ranging sensor 53 detects the distance between the body 22 and the touch panel 35 provided to the support 31. An optical axis of the first ranging sensor 53 is positioned to intersect the horizontal supporting portion 31b of the above support 31 via a through hole 25b provided in the second body 25. The first ranging sensor 53 outputs to the teaching controller 29 the distance between the body 22 and the touch panel 35 when the positioning pins 301 are detected by the touch panel 35.

The second detector 40 is disposed behind the pair of first detectors 30,30 when viewed from the front, the front being the direction in which the pair of first detectors 30,30 are disposed. Only one second detector 40 is disposed. The first detectors 30 and the second detector 40 are arranged in the Y-axis direction (lateral direction). The second detector 40 includes a bumper plate 41, a linear guide 43, a second restrictor 44, and a second ranging sensor 55.

The bumper plate 41 includes a vertical supporting portion 41a extending in the vertical direction and a horizontal supporting portion 41b extending in the horizontal direction. The vertical supporting portion 41a is the portion fixed to the first body 24 of the body 22 via the linear guide 43. The horizontal supporting portion 41b is a plate-shaped structure, and unlike the first detectors 30, the touch panel 35 is not fixed to the horizontal supporting portion 41b. The vertical supporting portion 41a is inserted through the through hole 25a provided in the second body 25. The linear guide 43 supports the bumper plate 41 to allow for sliding movement in the Z-axis direction with respect to the body 22. The second restrictor 44 is fixed to the body 22 and restricts the movement in the Z-axis direction by the linear guide 43 within a certain range. Specifically, the second restrictor 44 restricts the movement of the bumper plate 41 in the Z-axis direction to the extent that the bumper plate 41 can move within a hole 41c extending in the Z-axis direction.

The second ranging sensor 55 is fixed to the second body 25. The second ranging sensor 55 detects the distance between the body 22 and the bumper plate 41. An optical axis of the second ranging sensor 55 is positioned to intersect the horizontal supporting portion 41b of the above bumper plate 41 via the through hole 25a provided in the second body 25. The second ranging sensor 55 outputs to the teaching controller 29 the distance between the body 22 and the bumper plate 41 when the bumper plate 41 is contacted with the positioning pins 301.

Each of the third ranging sensors 27 is fixed to the second body 25, and its optical axis is directed downward from the second body 25. The third ranging sensor 27 measures the distance to an object under the teaching unit 20. When the third ranging sensor 27 detects that the distance between the body 22 and the load port 300 has reached a predetermined distance, the third ranging sensor 27 outputs information on the distance to the teaching controller 29 and also to the transport vehicle controller 8 via the first communication terminal 65 and the second communication terminal 67.

The power-receiving terminals 61 are fed with power from the respective power-feeding terminals 63B. The power-receiving terminals 61 feed power to the touch panels 35, the first ranging sensors 53, the second ranging sensor 55, the third ranging sensors 27, the second communication terminal 67, and the teaching controller 29 included in the teaching unit 20. The power-receiving terminals 61 are provided to protrude from an upper surface of the flange 23 in the teaching unit 20 and are extendable and retractable. More precisely, each of the power-receiving terminals 61 includes a base end portion 61A and a tip portion 61B, and the tip portion 61B is vertically movable with respect to the base end portion 61A. The tip portion 61B is biased by an elastic member or the like in the direction of protruding from the base end portion 61A.

The second communication terminal 67 transmits information on teaching. More precisely, the information on teaching output from the teaching controller 29 and the information output from the third ranging sensors 27 are transmitted to the transport vehicle controller 8 via the first communication terminal 65 and the second communication terminal 67.

In the present example embodiment, when the teaching unit 20 is held by the holder 7, the power-receiving terminals 61 and the power-feeding terminals 63B become energizable and the first communication terminal 65 and the second communication terminal 67 become communicable. More precisely, when the teaching unit 20 is held by the holder 7, the power-receiving terminals 61 and the respective power-feeding terminals 63B are in contact with each other, and the first communication terminal 65 and the second communication terminal 67 are close to each other within a predetermined distance (for example, within 50 mm). The first communication terminal 65 and the second communication terminal 67 are devices that exchange information through short-range wireless communication of an existing communication standard.

The teaching controller 29 is a controller configured or programmed to control various functions of the teaching unit 20. The teaching controller 29 outputs information on teaching to the transport vehicle controller 8 via the first communication terminal 65 and the second communication terminal 67. Specifically, the teaching controller 29 calculates, based on a transfer condition stored as an initial setting, and from the information on the positioning pins 301 (see FIG. 1) detected by the touch panels 35, 35, how much the positions of the pair of grippers 12, 12 deviate from the transfer condition stored as the initial setting (amount of correction for the transfer condition) when the traveling unit 3 is stopped at a predetermined position on the track R and the holder 7 is lowered a predetermined distance, and outputs the amount of correction for the transfer condition to the transport vehicle controller 8 via the first communication terminal 65 and the second communication terminal 67 as information on teaching.

In the teaching unit 20 of the present example embodiment, distances L1, L2 between the body 22 and the pair of touch panels 35, 35, and a distance L3 between the body 22 and the bumper plate 41 when the pair of touch panels 35, 35 and the bumper plate 41 contact the positioning pins 301, are acquired by the first ranging sensors 53 and the second ranging sensor 55. The teaching controller 29 can calculate the tilt angle of the load port 300 relative to the body 22 (tilt around X or Y axis in the horizontal plane) based on the distances L1, L2 arranged in the X-axis direction, the distances L1, L3 arranged in the Y-axis direction, or distances L2, L3 arranged in the Y-axis direction, using a known method, and calculate the amount of correction for the transfer condition.

In the overhead transport vehicle system 100 of the present example embodiment, an operation in which touch panels 35 of the teaching unit 20 are repeatedly brought into contact with and separated from the positioning pins 301 (see FIG. 1) (hereinafter simply referred to as "repetitive operation") is performed. After the repetitive operation is repeated a plurality of times, the teaching controller 29 calculates the transfer condition or the amount of correction for the transfer condition based on the detection results. The repetitive operation is performed by the transport vehicle controller 8 controlling the holder 7 based on the detection results by the first ranging sensors 53, the second ranging sensor 55, the third ranging sensors 27, and the pair of touch panels 35, 35. This repetitive operation can reduce the shaking of the teaching unit 20 to a level that does not cause problems in the calculation of the amount of correction.

As described above, the area controller 110 controls the overhead transport vehicle 1 to cause the holder 7 to hold the teaching unit 20, and uses the teaching unit 20 to perform teaching of transfer operation. More precisely, the area controller 110 is configured or programmed to perform holding control to cause the overhead transport vehicle 1 to travel toward a storage location such as a buffer where the teaching unit 20 is stored, stop at the storage location and lower the holder 7, and hold the teaching unit 20 by the holder 7, and teaching control to cause the overhead transport vehicle 1 holding the teaching unit 20 to travel toward the transfer position for the load port 300, stop at the transfer position, and perform transfer operation to the load port 300 to acquire teaching data.

The area controller 110 of the present example embodiment also may be configured or programmed to perform teaching control for a plurality of the load ports 300 after the above holding control. In the overhead transport vehicle system 100 of the present example embodiment, the track R has a loop portion P1, as illustrated in FIGS. 8 and 9. The load ports 300 (for example, three in the present example embodiment) are disposed along the loop portion P1. The buffer described above, where the teaching unit 20 is stored, is disposed below the track R, as are the load ports 300, although the buffer is not illustrated.

The area controller 110 is configured or programmed to cause the overhead transport vehicle 1 holding the teaching unit 20 to travel toward the transfer position for a specified load port 300. The area controller 110 is configured or programmed to cause the overhead transport vehicle 1 to stop at the transfer position for the specified load port 300 and to perform teaching for the specified load port 300 (see FIG. 8A). When teaching is completed for the specified load port 300, the area controller 110 causes the overhead transport vehicle 1 to travel around the loop portion P1 (see FIG. 8B), and then travel toward the transfer position for another load port 300 adjacent to the earlier load port 300.

The area controller 110 is configured or programmed to cause the overhead transport vehicle 1 to stop at the transfer position for the other load port 300 and to perform teaching for the other load port 300 (see FIG. 8C). When teaching is completed for the other load port 300, the area controller 110 causes the overhead transport vehicle 1 to travel around the loop portion P1 (see FIG. 8D), and then travel toward the transfer position for still another load port 300 adjacent to the other load port 300.

Figures 9E, 9F:
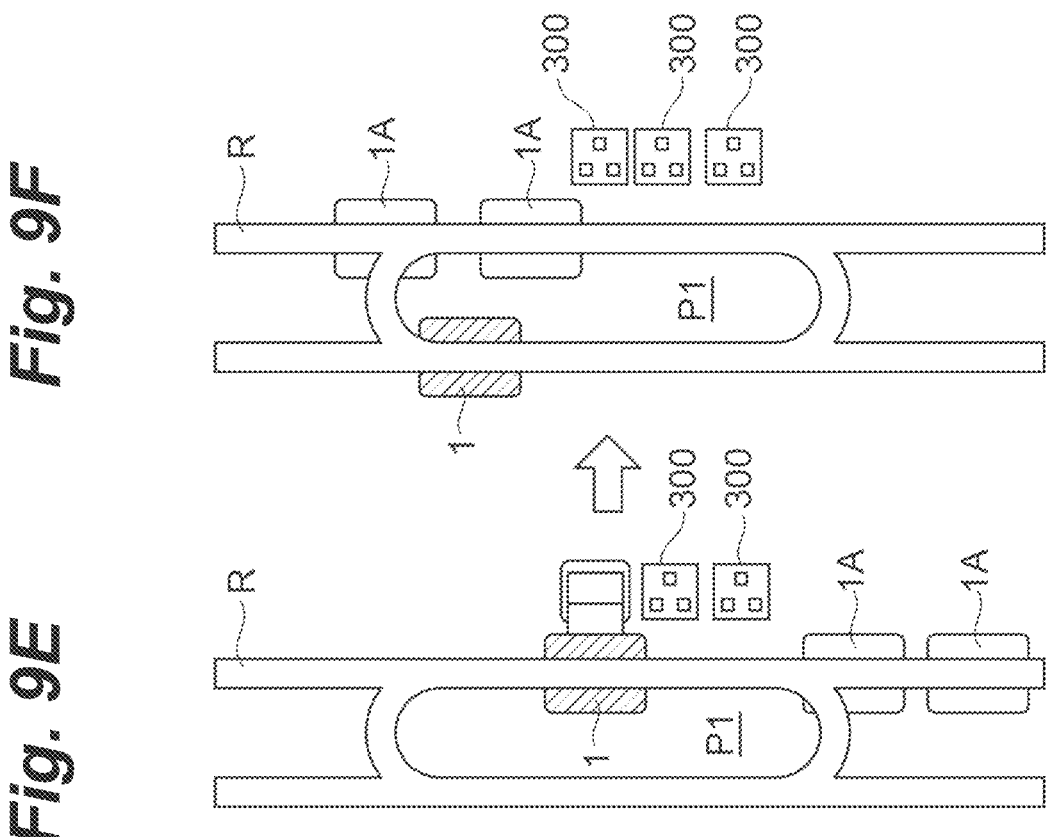
FIGS. 9E and 9F illustrate examples of the movement of an overhead transport vehicle when teaching is performed by an overhead transport vehicle system according to an example embodiment of the present invention.
Figures 10A, 10B, 10C:
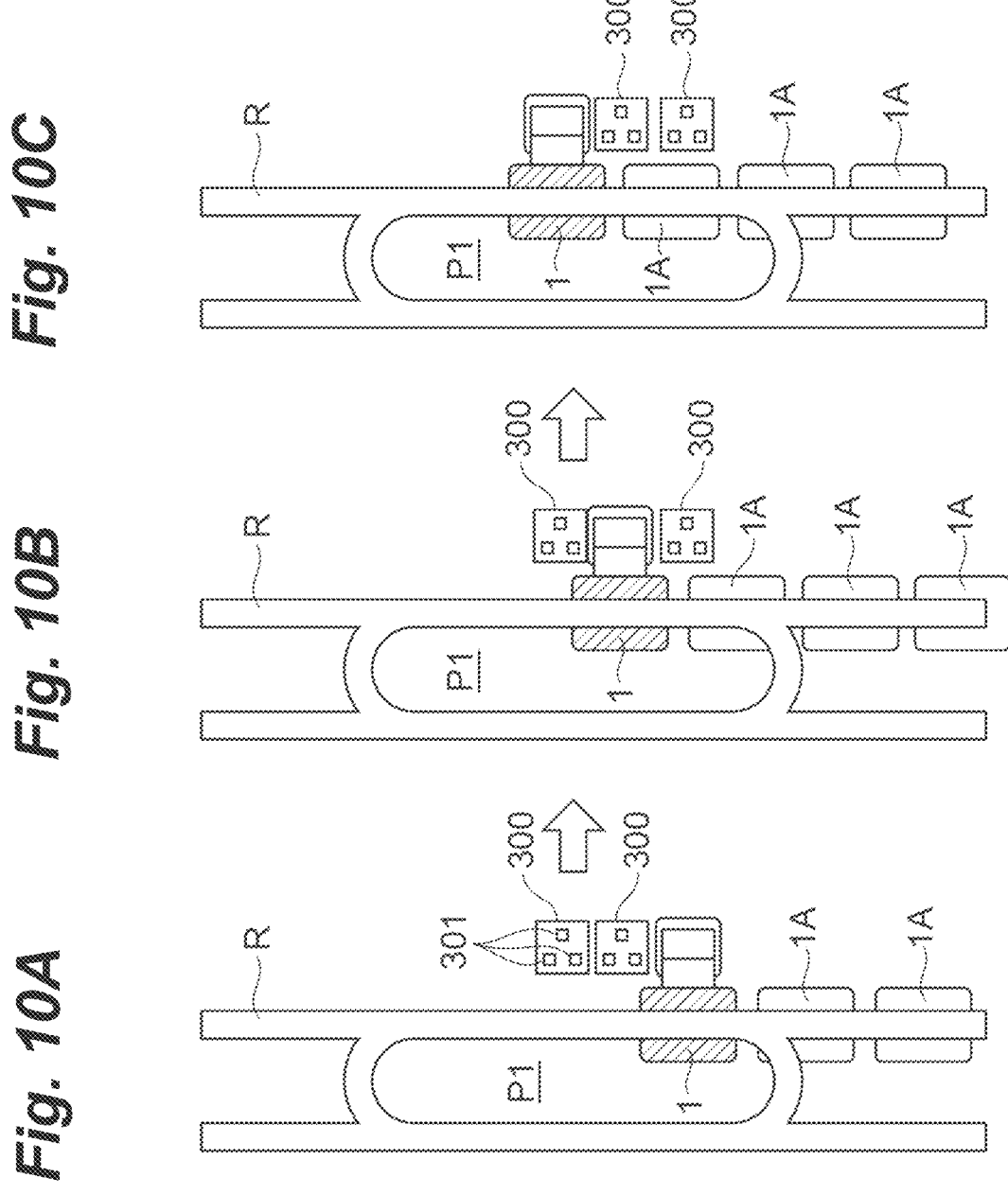
FIGS. 10A to 10C are diagrams illustrating examples of the movement of an overhead transport vehicle when teaching is performed by a conventional overhead transport vehicle system.

The area controller 110 is configured or programmed to cause the overhead transport vehicle 1 to stop at the transfer position for the still other load port 300 and to perform teaching for the still other load port 300 (see FIG. 9E). When teaching is completed for the still other load port 300, the area controller 110 causes the overhead transport vehicle 1 to travel to a storage location such as the buffer where the teaching unit 20 is stored (see FIG. 9F). The area controller 110 causes the overhead transport vehicle 1 to stop at the storage location and lower the holder 7 to place the teaching unit 20 held by the holder 7 on the buffer.

Such a series of teaching may be performed automatically by the area controller 110 based on a trigger. Examples of triggers include when an execution date according to a schedule arrives, when the vibration value generated when the container 200 is transferred to the load port 300 exceeds a threshold, when a transfer error or an event indicative of such an error occurs, and the like.

The area controller 110 is configured or programmed to store the information on the teaching of each load port 300 acquired in this way and transmit the information to each overhead transport vehicle 1. Each overhead transport vehicle 1 transfers the container 200 to the corresponding load port 300 based on the transfer condition stored in the transport vehicle controller 8 and the information on teaching transmitted from the area controller 110.

The following describes a working effect of the overhead transport vehicle system 100 according to the example embodiment described above. In the overhead transport vehicle system 100 of the above example embodiment, when the teaching unit 20 is held by the holder 7, the power-receiving terminals 61 and the power-feeding terminals 63B become energizable and the first communication terminal 65 and the second communication terminal 67 become communicable. This configuration makes it possible to feed electric power to the teaching unit 20 and exchange the information on teaching with the teaching unit 20 without requiring manual intervention. As a result, a series of teaching operations can be automated.

In the overhead transport vehicle system 100 of the above example embodiment, when the teaching unit 20 is held by the holder 7, the power-receiving terminals 61 and the respective power-feeding terminals 63B are in contact with each other, and the first communication terminal 65 and the second communication terminal 67 are close to each other within a predetermined distance. This allows electrical connection of the power-receiving terminals 61 and the power-feeding terminals 63B with a simple configuration, and also allows wireless communication between the first communication terminal 65 and the second communication terminal 67. The teaching unit 20 of the overhead transport vehicle system 100 of the above example embodiment can obtain power via the power-receiving terminals 61 and the power-feeding terminals 63B, and thus there is no need to mount a battery or the like, thereby eliminating the need to perform charging work and manage batteries.

As illustrated in FIG. 2A, the power-feeding terminals 63B of the overhead transport vehicle system 100 of the above example embodiment are located in the back side of the recesses 14 in the lower surface of the holder 7, reducing the possibility of a worker inadvertently touching the power-feeding terminals 63B. As a result, worker safety can be improved. Furthermore, since the power-receiving terminals 61 are extendable and retractable, the possibility of damage to the power-receiving terminals 61 and the power-feeding terminals 63B can be reduced even if the power-receiving terminals 61 make strong contact with the power-feeding terminals 63B when the holder 7 is holding the teaching unit 20.

As illustrated in FIG. 2B, the tapered portion 14a that guides the power-receiving terminal 61 to the back side of the recess 14 is located on the opening side of the recess 14 of the overhead transport vehicle system 100 of the above example embodiment, so that the power-receiving terminal 61 and the power-feeding terminal 63B can be easily connected to each other.

In the overhead transport vehicle system 100 of the above example embodiment, the area controller 110 is configured or programmed to perform the holding control to cause the holder 7 to hold the teaching unit 20 placed on a predetermined buffer, and the teaching control to cause the overhead transport vehicle 1 holding the teaching unit 20 to acquire the teaching data of the specified load port 300. This configuration allows regular teaching to be automated.

As illustrated in FIGS. 8A to 8D and 9E and 9F, when teaching is completed for the specified load port 300 by the overhead transport vehicle 1, the area controller 110 of the overhead transport vehicle system 100 of the above example embodiment causes the overhead transport vehicle 1 to travel around the loop portion P1, and then to perform teaching for another load port 300 adjacent to the specified load port 300.

Here, conventional teaching control is explained. A transport vehicle controller causes the overhead transport vehicle 1 holding the teaching unit 20 to travel toward the transfer position for a specified load port 300. The transport vehicle controller causes the overhead transport vehicle 1 to stop at the transfer position for the specified load port 300 and to perform teaching for the specified load port 300 (see FIG. 10A). When teaching is completed for the specified load port 300 by the overhead transport vehicle 1, the transport vehicle controller causes the overhead transport vehicle 1 to move to the transfer position of another load port 300 adjacent to the earlier load port 300, without traveling around the loop portion P1. The transport vehicle controller causes the overhead transport vehicle 1 to stop at the transfer position for the other load port 300 and to perform teaching for the other load port 300 (see FIG. 10B).

When teaching is completed for the other load port 300, the transport vehicle controller causes the overhead transport vehicle 1 to move to the transfer position for still another load port 300 adjacent to the other load port 300, without traveling around the loop portion P1. The transport vehicle controller causes the overhead transport vehicle 1 to stop at the transfer position for the still other load port 300 and to perform teaching for the still other load port 300 (see FIG. 10C). Under this type of control, the overhead transport vehicle 1 holding the teaching unit 20 performs teaching for the three load ports 300 in succession, and subsequent overhead transport vehicles 1A are congested for a long time.

In this regard, the area controller 110 of the above example embodiment is configured or programmed to cause the overhead transport vehicle 1 to travel around for each teaching at one load port 300, thus reducing or minimizing the congestion of other overhead transport vehicles 1A following the overhead transport vehicle 1 that is performing the teaching. As a result, even when teaching is performed while the overhead transport vehicle system 100 is in operation, the occurrence of congestion of the overhead transport vehicles 1A can be reduced.

Example embodiments have been described above, but aspects of the present invention are not limited to the example embodiments described above. Various modifications can be made without departing from the gist of the present invention.

In the overhead transport vehicle system 100 of the above example embodiments, the example of the overhead transport vehicle 1 holding the teaching unit 20 performing teaching for each load port 300 is given, but it is also possible to acquire the characteristics (i.e., machine differences) of each overhead transport vehicle 1 and appropriately adjust the state of the holder 7 for each overhead transport vehicle 1. Specifically, when the area controller 110 causes each overhead transport vehicle 1 to hold the teaching unit 20 by the holder 7 and transfer the teaching unit 20 to each load port 300 based on the transfer condition (or the transfer condition and the information on teaching acquired by the method described above), the characteristics of each overhead transport vehicle 1 and each load port 300 are calculated based on the information acquired by the teaching unit 20 for the corresponding load port 300.

The information acquired by the teaching unit 20 is the information acquired from the touch panels 35, the first ranging sensors 53, and the second ranging sensor 55, and more precisely, the information on the positions of the positioning pins 301, and the information on the distances L1, L2 between the body 22 and the pair of touch panels 35, 35 and the distance L3 between the body 22 and the bumper plate 41 when the pair of touch panels 35, 35 and the bumper plate 41 contact the positioning pins 301. The area controller 110 stores the characteristics for each overhead transport vehicle 1 obtained in this way and transmits the information to each overhead transport vehicle 1. Each overhead transport vehicle 1 transfers the container 200 to each load port 300 based on the transfer condition stored in the transport vehicle controller 8, the information on teaching for the corresponding load port 300 transmitted from the area controller 110, and the characteristics of the corresponding overhead transport vehicle 1.

The overhead transport vehicle systems 100 of the above example embodiments and modifications have been described with an example in which the power-feeding terminal 63B is located in the back side of the recess 14 formed in the base 11. For example, when the grippers 12 hold the teaching unit 20, the power-feeding terminals 63B may be pushed out (advanced) by the grippers 12. Even with this configuration, the possibility of a worker inadvertently touching the power-feeding terminals 63B can be reduced.

While example embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle system comprising:
   an overhead transport vehicle to travel on a track to transport an object and including a holder to transfer the object to a placement portion below the track; and
   a teaching unit; wherein
   the system is configured or programmed to cause the overhead transport vehicle to hold the teaching unit and perform teaching of transfer operation to the placement portion; wherein
   the holder includes:
     a power-feeding terminal to feed power from a power source; and
     a first communication terminal to receive information on the teaching;
   the teaching unit includes:
     a power-receiving terminal to which the power is fed; and
     a second communication terminal to transmit the information on the teaching; and
   when the teaching unit is held by the holder, the power-receiving terminal and the power-feeding terminal become energizable and the first communication terminal and the second communication terminal become communicable.

2. The overhead transport vehicle system according to claim 1, wherein when the teaching unit is held by the holder, the power-receiving terminal and the power-feeding terminal are in contact with each other, and the first communication terminal and the second communication terminal are within a predetermined distance to each other.

3. The overhead transport vehicle system according to claim 1, wherein the power-feeding terminal is located at a back side of a recess in a lower surface of the holder; and the power-receiving terminal protrudes from an upper surface of the teaching unit and is extendable and retractable.

4. The overhead transport vehicle system according to claim 3, wherein a tapered portion to guide the power-receiving terminal to a back side of the recess is on an opening side of the recess.

5. The overhead transport vehicle system according to claim 1, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

6. The overhead transport vehicle system according to claim 5, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

7. The overhead transport vehicle system according to claim 2, wherein the power-feeding terminal is located at a back side of a recess in a lower surface of the holder; and the power-receiving terminal protrudes from an upper surface of the teaching unit and is extendable and retractable.

8. The overhead transport vehicle system according to claim 7, wherein a tapered portion to guide the power-receiving terminal to a back side of the recess is located on an opening side of the recess.

9. The overhead transport vehicle system according to claim 2, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

10. The overhead transport vehicle system according to claim 3, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

11. The overhead transport vehicle system according to claim 4, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

12. The overhead transport vehicle system according to claim 7, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

13. The overhead transport vehicle system according to claim 8, further comprising a controller configured or programmed to control traveling of the overhead transport vehicle; wherein the controller is configured or programmed to perform:

holding control to cause the overhead transport vehicle to travel toward a predetermined position where the teaching unit is stored, stop at the predetermined position and lower the holder, and hold the teaching unit by the holder; and teaching control to cause the overhead transport vehicle holding the teaching unit to travel toward a transfer position corresponding to the placement portion, stop at the transfer position, and perform a transfer operation on the placement portion to acquire teaching data.

14. The overhead transport vehicle system according to claim 9, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

15. The overhead transport vehicle system according to claim 10, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

16. The overhead transport vehicle system according to claim 11, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

17. The overhead transport vehicle system according to claim 12, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

18. The overhead transport vehicle system according to claim 13, wherein the track includes a loop portion with a loop shape;

a plurality of the placement portions are located along the loop portion; and when the teaching is completed for one of the plurality of placement portions, the controller is configured or programmed to cause the overhead transport vehicle to travel around the loop portion, and then to perform the teaching for another of the plurality of placement portions that is adjacent to the one of the plurality of placement portions.

* * * * *